United States Patent
Lee (10) Patent No.: US 9,391,304 B2
(45) Date of Patent: Jul. 12, 2016

(54) ORGANIC LIGHT-EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: A Rong Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/629,446

(22) Filed: Feb. 23, 2015

(65) Prior Publication Data

US 2016/0111688 A1   Apr. 21, 2016

(30) Foreign Application Priority Data

Oct. 17, 2014   (KR) .................. 10-2014-0140798

(51) Int. Cl.

| | |
|---|---|
| *H01L 51/56* | (2006.01) |
| *H01L 27/32* | (2006.01) |
| *H01L 51/00* | (2006.01) |
| *H01L 51/50* | (2006.01) |

(52) U.S. Cl.
CPC ............ *H01L 51/56* (2013.01); *H01L 27/3246* (2013.01); *H01L 51/0007* (2013.01); *H01L 51/5056* (2013.01); *H01L 51/5088* (2013.01); *H01L 2227/323* (2013.01)

(58) Field of Classification Search
CPC .... H05B 33/00; H05B 33/04; H01L 51/0005;
H01L 27/15; H01L 27/32; H01L 27/3241;
H01L 21/00; H01L 21/44; H01L 21/31;
H01L 21/302; H01L 21/84; H01L 21/461
See application file for complete search history.

(56) References Cited

U.S. PATENT DOCUMENTS

2005/0287392 A1* 12/2005 Toyoda ............... H01L 51/5048
428/690

FOREIGN PATENT DOCUMENTS

| JP | 2008-243406 A | 10/2008 |
|---|---|---|
| JP | 2013-51391 A | 3/2013 |
| KR | 10-2011-0094458 A | 8/2011 |
| KR | 10-2012-0022575 A | 3/2012 |

* cited by examiner

*Primary Examiner* — Kyoung Lee
(74) *Attorney, Agent, or Firm* — Lewis Roca Rothgerber Christie LLP (57) ABSTRACT

An organic light-emitting display device is provided. An organic light-emitting display device, including: a substrate; a pixel-defining layer on the substrate and defining a light-emitting region; and an organic light-emitting element over the light-emitting region, wherein the pixel-defining layer includes a first pixel-defining layer on the substrate and a second pixel-defining layer on the first pixel-defining layer, the organic light-emitting element includes a first organic layer contacting the first pixel-defining layer at either end thereof, a second organic layer on the first organic layer and contacting the second pixel-defining layer at either end thereof, and an organic light-emitting layer on the second organic layer, and the first pixel-defining layer is lyophilic.

18 Claims, 10 Drawing Sheets

ORGANIC LIGHT-EMITTING DISPLAY DEVICE AND METHOD OF MANUFACTURING THE SAME

CROSS-REFERENCE TO RELATED APPLICATION

This application claims priority to and the benefit of Korean Patent Application No. 10-2014-0140798 filed on Oct. 17, 2014 in the Korean Intellectual Property Office, the disclosure of which is incorporated herein by reference in its entirety.

BACKGROUND

1. Field

The present invention relates to an organic light-emitting display device and a method of manufacturing the same.

2. Description of the Related Art

Organic light-emitting display devices have garnered much attention as next-generation display devices because of their characteristics, i.e., wide viewing angle, excellent contrast, and fast response rate. An organic light-emitting display device may include an anode electrode, a cathode electrode, and an emissive layer provided between the anode electrode and the cathode electrode and formed of an organic material. When a positive voltage and a negative voltage are applied to the anode electrode and the cathode electrode, respectively, holes from the anode electrode may move to the emissive layer through a hole injection layer and a hole transporting layer, and electrons from the cathode electrode may move to the emissive layer through an electron injection layer and an electron transporting layer. The holes and the electrons may recombine with each other in the emissive layer. Due to the recombination of the holes and the electrons, excitons may be generated. When the excitons transition from an excited state to a ground state, the emissive layer may emit light, and as a result, an image may be displayed.

The organic light-emitting display device may also include a pixel-defining layer, which has an opening through which the top of the anode electrode is exposed. An organic light-emitting layer may be formed on a part of the anode electrode exposed through the opening of the pixel-defining layer.

Some of the layers that constitute the organic light-emitting layer may be formed by a solution process. The solution process may be performed by mixing an organic material with a solvent so as to form a solution composition and adding, dropwise, the solution composition to the opening of the pixel-defining layer. Since the pixel-defining layer is lyophobic and the anode electrode is lyophilic, the solution composition may form a pinning point at a certain location on the pixel-defining layer. A pinning point is a location in a crystal that opposes the motion of dislocations. Further, the hole injection layer, the hole transporting layer, and the light-emitting layer may all have the same pinning point, and as a result, the hole injection layer and the electron transporting layer may directly contact each other at the pinning point. That is, the hole transporting layer and the electron transporting layer may be directly connected without the light-emitting layer therebetween, and thus, a leakage current may be generated.

SUMMARY

Exemplary embodiments of the present invention provide a method of manufacturing an organic light-emitting display device, in which an organic light-emitting layer can be formed by a solution process while preventing or reducing the generation of a leakage current.

Exemplary embodiments of the present invention also provide an organic light-emitting display device, in which an organic light-emitting layer can be formed by a solution process while preventing or reducing the generation of a leakage current.

However, exemplary embodiments of the present invention are not restricted to those set forth herein. The above and other exemplary embodiments of the present invention will become more apparent to one of ordinary skill in the art to which the present invention pertains by referencing the detailed description of embodiments of the present invention given below.

According to an exemplary embodiment of the present invention, an organic light-emitting display device, includes: a substrate; a pixel-defining layer on the substrate and defining a light-emitting region; and an organic light-emitting element over the light-emitting region, wherein the pixel-defining layer includes a first pixel-defining layer on the substrate and a second pixel-defining layer on the first pixel-defining layer. The organic light-emitting element includes a first organic layer contacting the first pixel-defining layer at either end thereof, a second organic layer on the first organic layer and contacting the second pixel-defining layer at either end thereof, and an organic light-emitting layer on the second organic layer, and the first pixel-defining layer shows lyophilic properties.

The second pixel-defining layer may show lyophobic properties.

A concentration of fluorine ions bonded onto the surface of the first pixel-defining layer may differ from a concentration of fluorine ions bonded onto the surface of the second pixel-defining layer.

The second pixel-defining layer may show lyophilic properties.

The first organic layer may be a hole injection layer and the second organic layer may be a hole transporting layer.

The first organic layer may be formed by using a solvent that evaporates at a temperature in a range from a first temperature to a second temperature and the first pixel-defining layer may show lyophobic properties at a temperature lower than the first temperature.

The organic light-emitting layer may further include a third organic layer on the second organic layer and ends of the third organic layer and ends of the first organic layer may not contact each other.

According to an exemplary embodiment of the present invention a method of manufacturing an organic light-emitting display device, includes: forming a first electrode on a substrate; forming a pixel-defining layer, which includes an opening that exposes a part of the first electrode therethrough, a first pixel-defining layer that is on the first electrode and the substrate and a second pixel-defining layer that is on the first pixel-defining layer; lyophobizing the surface of the pixel-defining layer and lyophilizing the surface of the first electrode; forming a first organic layer in the opening at a temperature in a range from a first temperature to a second temperature where the first pixel-defining layer is lyophilized; and forming a second organic layer on the first organic layer.

The forming the first organic layer may include applying a solution composition, which is obtained by mixing a solvent and a first organic material, into the opening and evaporating the solvent at the temperature in the range from the first temperature to the second temperature.

The forming the second organic layer may include applying a solution composition, which is obtained by mixing a solvent and a second organic material, into the opening and evaporating the solvent at the temperature in the range from the first temperature to the second temperature.

The second pixel-defining layer may not be lyophilized at the temperature in the range from the first temperature to the second temperature.

The forming the second organic layer may include applying a solution composition, which is obtained by mixing a solvent and a second organic material, into the opening and evaporating the solvent at a third temperature, which is higher than the second temperature.

The second pixel-defining layer may be lyophilized at the third temperature.

The first organic layer may be a hole injection layer and the second organic layer is a hole transporting layer.

A method of manufacturing an organic light-emitting display device further including: forming a third organic layer on the second organic layer.

According to an exemplary embodiment of the present invention a method of manufacturing an organic light-emitting display device, includes: forming a first electrode on a substrate; forming a pixel-defining layer, which includes an opening that exposes a part of the first electrode therethrough, a first pixel-defining layer on the first electrode and the substrate; and a second pixel-defining layer on the first pixel-defining layer; lyophobizing the surface of the pixel-defining layer and lyophilizing the surface of the first electrode; forming a first organic layer in the opening; lyophilizing only the surface of the first pixel-defining layer; and forming a second organic layer on the first organic layer.

The lyophilizing the surface of the first pixel-defining layer may include lowering a concentration of fluorine ions at the surface of the first pixel-defining layer below a concentration of fluorine ions at the surface of the second pixel-defining layer.

The lyophilizing the surface of the first pixel-defining layer may include heating the first pixel-defining layer to a temperature such that a bonding between the surface of the first pixel-defining layer and fluorine ions can be severed.

The lyophilizing the surface of the first pixel-defining layer may include applying light only to the surface of the first pixel-defining layer.

The first organic layer may be a hole injection layer and the second organic layer is a hole transporting layer.

According to the exemplary embodiments, it is possible to prevent or substantially prevent the generation of a leakage current.

Also, it is possible to improve the efficiency characteristics and the lifetime of an organic light-emitting element.

Other features and exemplary embodiments will be apparent from the following detailed description, the drawings, and the claims.

DETAILED DESCRIPTION

Aspects and features of embodiments of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concepts of the present invention to those skilled in the art, and the present invention will be defined by the appended claims and their equivalents. Thus, in some embodiments, well-known structures and devices are not shown in order to not obscure the description of the embodiments of present invention with unnecessary detail. Like reference numbers refer to like elements throughout. In the drawings, the thickness of layers and regions are exaggerated for clarity.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "coupled to," or "connected to" another element or layer, it can be directly on, coupled to, or connected to the other element or layer or intervening elements or layers may be present. When an element is referred to as being "directly on," "directly coupled to," or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the present invention. Accordingly, the exemplary views may be modified depending on manufacturing technologies and/or tolerances. Therefore, the embodiments of the present invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the present invention.

Exemplary embodiments will be described hereinafter with reference to the accompanying drawings.

Figure 1:
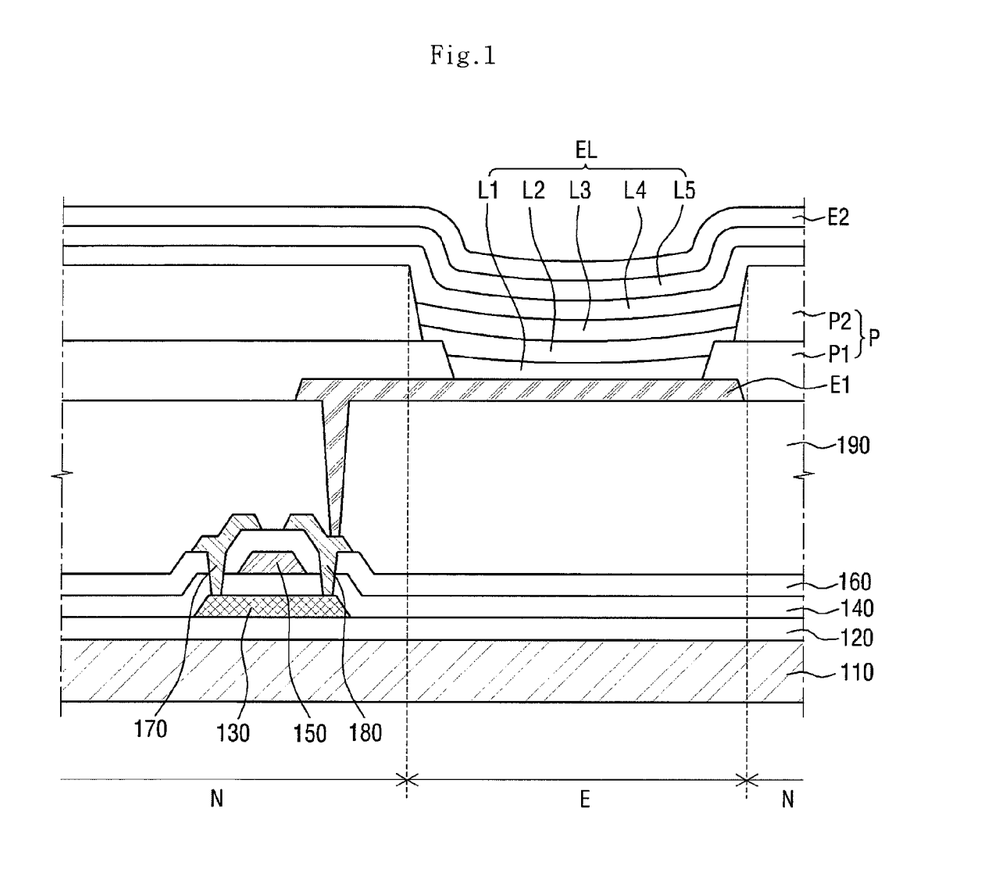
FIG. 1 is a cross-sectional view illustrating an organic light-emitting display device according to an exemplary embodiment of the present invention.

FIG. 1 is a cross-sectional view illustrating an organic light-emitting display device according to an exemplary embodiment of the present invention. Referring to FIG. 1, an organic light-emitting display device according to an exemplary embodiment of the present invention includes a substrate 110, a pixel-defining layer P, and an organic light-emitting layer EL. The organic light-emitting display device may also include a buffer layer 120, a semiconductor pattern 130, a gate insulating layer 140, a gate electrode 150, an interlayer dielectric layer 160, a source electrode 170, a drain electrode 180, a planarization layer 190, a first electrode E1 and a second electrode E2.

The substrate 110 may be an insulating substrate. The insulating substrate may be formed of a transparent glass material containing $SiO_2$, which is transparent, as a main ingredient thereof. In an exemplary embodiment, the insulating substrate may be formed of an opaque material or a plastic material. The insulating substrate may be a flexible substrate that can be bent, folded or rolled.

The substrate 110 may include a light-emitting region E and a non-light-emitting region N. The light-emitting region E may be a region through which light is emitted to the outside of the organic light-emitting display device, and the non-light-emitting region N may be a region through which no light is emitted to the outside of the organic light-emitting display device. The light-emitting region E may be a region where the pixel-defining layer P is not located, and the non-light-emitting region N may be a region where the pixel-defining layer P is located. That is, the light-emitting region E and the non-light-emitting region N may be defined by the pixel-defining layer P. In a plan view, the light-emitting region E may be arranged in a matrix form, and the non-light-emitting region N may be arranged to surround the light-emitting region E.

The buffer layer 120 may be formed on the substrate 110. The buffer layer 120 may prevent or substantially prevent metallic atoms or impurities from being diffused from the substrate 110. Also, the buffer layer 120 may improve the evenness of the surface of the substrate 110 in case the surface of the substrate 110 is irregular. The buffer layer 120 may be formed of a silicon compound. For example, the buffer layer 120 may include silicon oxide, silicon nitride, silicon oxynitride, silicon oxycarbide, and silicon carbonitride, which may be used alone or in combination with each other.

The semiconductor pattern 130 may be formed on the buffer layer 120. The semiconductor pattern 130 may include a source region, a drain region and a channel region. The semiconductor pattern 130 may be formed of amorphous silicon, polycrystalline silicon, or monocrystalline silicon. Alternatively, the semiconductor pattern 130 may be formed of an oxide semiconductor.

The gate insulating layer 140 may be formed on the buffer layer 120 to cover the semiconductor pattern 130. The gate insulating layer 140 may be formed of silicon oxide or metal oxide. Examples of the metal oxide that can be used in the gate insulating layer 140 may include hafnium oxide (HfOx), aluminum oxide (AlOx), zirconium oxide (ZrOx), titanium oxide (TiOx), and tantalum oxide (TaOx), which may be used alone or in combination with each other.

The gate electrode 150 may be formed on the gate insulating layer 140. The gate electrode 150 may be formed on a part of the gate insulating layer 140 where the semiconductor pattern 130 is located. The gate electrode 150 may include a metal, an alloy, a metal nitride, a conductive metal oxide, and/or a transparent conductive material. For example, the gate electrode 150 may include one or more of aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chromium (Cr), chromium nitride (CrOx), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), and indium zinc oxide (IZO), which may be used alone or in combination with each other.

The interlayer dielectric layer 160 may be formed on the gate insulating layer 140 to cover the gate electrode 150. The interlayer dielectric layer 160 may be formed of a silicon compound. For example, the interlayer dielectric layer 160 may include one or more of silicon oxide, silicon nitride, silicon oxynitride, silicon carbonitride, and silicon oxycarbide, which may be used alone or in combination with one another.

The source electrode 170 and the drain electrode 180 may be formed on the interlayer dielectric layer 160. The source electrode 170 and the drain electrode 180 may be isolated from each other by a distance (e.g., a predetermined distance) with the gate electrode 150 interposed therebetween, and may be disposed near the gate electrode 150. For example, the source electrode 170 and the drain electrode 180 may contact the source region and the drain region, respectively, the semiconductor pattern 130 through the interlayer dielectric layer 160.

The source electrode 170 and the drain electrode 180 may include a metal, an alloy, a metal nitride, a conductive metal oxide, and/or a transparent conductive material. For example, the source electrode 170 and the drain electrode 180 may include aluminum (Al), an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, zinc oxide, ITO, tin oxide, indium oxide, gallium oxide, and/or IZO, which may be used alone or in combination with each other.

When the formation of the source electrode 170 and the drain electrode 180 on the interlayer dielectric layer 160 is complete, a thin-film transistor (TFT) including the semiconductor pattern 130, the gate insulating layer 140, the gate electrode 150, the source electrode 170, and the drain electrode 180 may be provided on the substrate 110 as a switching device of the organic light-emitting display device.

The planarization layer 190 may be formed on the interlayer dielectric layer 160 to cover the source electrode 170 and the drain electrode 180. The planarization layer 190 may be thick enough to completely cover the source electrode 170 and the drain electrode 180. The planarization layer 190 may have a flat top surface. The planarization layer 190 may be formed of an organic material or an inorganic material. For example, the planarization layer 190 may include photoresist, an acryl-based polymer, a polyimide-based polymer, a polyamide-based polymer, a siloxane-based polymer, a polymer containing a photosensitive acryl carboxyl group, a novolac resin, an alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and/or titanium oxide, which may be used alone or in combination with each other.

The first electrode E1 may be disposed on the planarization layer 190. The first electrode E1 may overlap the light-emitting region E of the substrate 110. The first electrode E1 may be inserted into a hole that penetrates the planarization layer 190 and may thus be electrically connected (e.g., coupled) to the drain electrode 180. The first electrode E1 may be an anode electrode or a cathode electrode. In a case when the first electrode E1 is an anode electrode, the second electrode E2 may be a cathode electrode. In the description that follows, it is assumed that the first electrode E1 and the second electrode E2 may be an anode electrode and a cathode electrode, respectively, but the present invention is not limited thereto. That is, the first electrode E1 and the second electrode E2 may be a cathode electrode and an anode electrode, respectively.

In a case when the first electrode E1 is used as an anode electrode, the first electrode E1 may be formed of a conductive material with a high work function. When the organic light-emitting display device is a bottom emission type, the first electrode E1 may be formed of ITO, IZO, ZnO, $In_2O_3$, or a stack layer thereof. When the organic light-emitting display device is a top emission type, the first electrode E1 may include a reflective layer (not illustrated), which is formed of Ag, Mg, Al, Pt, Pd, gold (Au), Ni, Nd, iridium (Ir), Cr, lithium (Li), or calcium (Ca). Various modifications can be made to the first electrode E1 without departing from the scope of the present invention. For example, the first electrode E1 may be formed of two different materials selected from among those set forth herein to have a double (or more)-layer structure.

The pixel-defining layer P may be formed on the first electrode E1 and the planarization layer 190. The pixel-defining layer P may expose a part of the first electrode E1. That is, the pixel-defining layer P may include an opening through which a part of the first electrode E1 is exposed. The part of the first electrode E1 exposed by the pixel-defining layer P may become the light-emitting region E, and a part of the first electrode E1 covered by the pixel-defining layer P may become the non-light-emitting region N.

The pixel-defining layer P may also include a first pixel-defining layer P1 and a second pixel-defining layer P2. The first pixel-defining layer P1 may be formed on the first electrode E1 and the planarization layer 190. The second pixel-defining layer P2 may be formed on the first pixel-defining layer P1. That is, the pixel-defining layer P may be formed as a double layer.

The first pixel-defining layer P1 and the second pixel-defining layer P2 may have different slopes from each other. That is, the inclination angle formed by an inclined surface of the first pixel-defining layer P1 and the top surface of the first electrode E1 may differ from the inclination angle formed by an inclined surface of the second pixel-defining layer P2 and the top surface of the first pixel-defining layer P1. The second pixel-defining layer P2 may have a greater inclination angle than the first pixel-defining layer P1.

The organic light-emitting layer EL may be formed by a solution process. For example, the solution process may be one of spin coating, inkjet printing, gravure printing, roll-to-roll processing, syringe injection, dip coating, spray coating, relief printing, lithography printing, flexography printing, and screen printing. A solution composition for use in the solution process may be easily guided to the opening by the second pixel-defining layer P2 even if applied into the second pixel-defining layer P2, due to the second pixel-defining layer P2 having a large inclination angle.

The first pixel-defining layer P1 may be formed to protrude inwardly beyond the second pixel-defining layer P2. In a case when the organic light-emitting layer EL is formed by the solution process, the organic light-emitting layer EL may not be uniformly formed. That is, the thickness of the organic light-emitting layer EL may increase (e.g., become greater) from the center toward the edges of the organic light-emitting layer EL. Such variations in the thickness of the organic light-emitting layer EL may result in variations in luminance between areas. The first pixel-defining layer P1, which inwardly protrudes further than the second pixel-defining layer P2, may prevent or substantially prevent the organic light-emitting layer EL from becoming thicker on the edges than elsewhere thereof.

In a case when the organic light-emitting layer EL is formed by the solution process, the pixel-defining layer P may be generally lyophobic. That is, the surface of the first electrode E1 in the opening to which a solution composition is added dropwise may be lyophilized, and the pixel-defining layer P surrounding the opening may be lyophobized. As a result, the solution composition would not combine with the pixel-defining layer P even if applied to the pixel-defining layer P, and may thus be easily moved into the opening.

A lyophobization process for the pixel-defining layer P may be a process of allowing fluorine ions to adhere onto the surface of the pixel-defining layer P. In the lyophobization process, a fluorine compound such as $CF_4$ may be used as a reaction gas. That is, fluorine ions may be generated by applying plasma or ultraviolet (UV) light in a $CF_4$ gas atmosphere, and the fluorine ions may adhere onto the surface of the pixel-defining layer P. When bonded with fluorine, the surface of the pixel-defining layer P may be lyophilic and may have low surface energy. That is, the degree of lyophilization or lyophobization of the surface of the pixel-defining layer P may be determined by the concentration of fluorine ions on the surface of the pixel-defining layer P.

However, the lyophobization process is not limited to that set forth herein. That is, the pixel-defining layer P may be formed of an organic or inorganic material containing fluorine ions, and a temperature (e.g., a predetermined temperature) may be applied to the pixel-defining layer P to expose the fluorine ions on the surface of the pixel-defining layer P.

The first pixel-defining layer P1 may be lyophilic. That is, the first pixel-defining layer P1 may be converted from a lyophobic state to a lyophilic state. The transition of the first pixel-defining layer P1 from the lyophobic state to the lyophilic state is related to the structure of the organic light-emitting layer EL.

The organic light-emitting layer EL is formed on the first electrode E1. The organic light-emitting layer EL may overlap the light-emitting region E of the substrate 110. When a current is applied to the organic light-emitting layer EL, electrons and holes in the organic light-emitting layer EL may recombine with each other, thereby generating excitons. Due to the energy from the excitons, light with a wavelength (e.g., a predetermined wavelength) may be generated.

The organic light-emitting layer EL may be formed of a low- or high-molecular organic material. The organic light-emitting layer EL may include at least two organic layers. That is, the organic light-emitting layer EL may include a first organic layer L1 and a second organic layer L2. The organic light-emitting layer EL may also include a third organic layer L3, a fourth organic layer L4, and a fifth organic layer L5. The first organic layer L1, the second organic layer L2, the third organic layer L3, the fourth organic layer L4, and the fifth organic layer L5 may be a hole injection layer (HIL), a hole transporting layer (HTL), an emissive layer (EML), an electron transporting layer (ETL), and an electron injection layer (EIL), respectively, but the present invention is not limited thereto.

At least the first organic layer L1 and the second organic layer L2 may be formed by the aforementioned solution process. That is, the first organic layer L1 may be supplied onto the surface of the first electrode E1 in a state where a solvent and an organic material are mixed. The surface of the first electrode E1 may be in a lyophilic state. For example, the first electrode E1 may be preheated to a temperature (e.g., a predetermined temperature) to adjust particles on the surface of the first electrode E1 and the surface energy of the first electrode E1. During the preheating of the first electrode E1, fluorine ions on the surface of the first electrode E1 may be removed. As a result, the first electrode E1 may be placed in a lyophilic state with a high surface energy.

The force of bonding between the pixel-defining layer P and fluorine ions may be stronger than the force of bonding between the first electrode E1 and fluorine ions, and the first pixel-defining layer P1 and the second pixel-defining layer P2 may both be maintained to be lyophobic. The surface energy of the first electrode E1 may affect the first pixel-defining layer P1, starting from the lower side of the first pixel-defining layer P1, and may cause the bottom surface of the first pixel-defining layer P1 may be lyophilized. That is, a lyophilic/lyophobic interface may be formed at a particular location on the side of the first pixel-defining layer P1. The first organic layer L1, which is provided to the surface of the first electrode E1, may form a pinning point at a particular location on the surface of the first pixel-defining layer P1.

A drying process for the first organic layer L1 may be performed under temperature conditions ranging from a first temperature to a second temperature. That is, the solvent of the first organic layer L1 may evaporate at a temperature in the range from the first temperature to the second temperature, and the first organic layer L1 may be dried with only the organic material thereof being left behind. The first organic layer L1 may be dried while maintaining the pinning point between the first organic layer L1 and the first pixel-defining layer P1, such that the first organic layer L may still contact the first pixel-defining layer P1 at either end thereof.

The fluorine ions bonded onto the surface of the first pixel-defining layer P1 may be removed at a temperature in the range from the first temperature to the second temperature. The first temperature may be higher than the temperature to which the first electrode E1 is preheated to adjust the surface energy of the first electrode E1. That is, the bonding between the first pixel-defining layer P1 and fluorine ions may be severed. That is, the first pixel-defining layer P1 may become lyophilic.

The surface of the second pixel-defining layer P2 may have a stronger bonding force than the surface of the first pixel-defining layer P1 with respect to fluorine ions. That is, the second pixel-defining layer P2 may be formed of a material with a stronger bonding force than the material of the first pixel-defining layer P1 with respect to fluorine ions. Accordingly, the second pixel-defining layer P2 may maintain its lyophobic state at a temperature in the range from the first temperature to the second temperature. The surface energy of the first pixel-defining layer P1 that is lyophilic may affect the lower side of the second pixel-defining layer P2, and as a result, a lyophilic/lyophobic interface may be formed at a particular location on the side of the second pixel-defining layer P2. The lyophilic/lyophobic interface may be a pinning point of the second organic layer L2, which is formed on the first organic layer L1.

The second organic layer L2 may be dried while maintaining the pinning point on the surface of the second pixel-defining layer P2. The second organic layer L2 may contact the second pixel-defining layer P2 at either end thereof. The second organic layer L2 may form a pinning point at a different location from where the first organic layer L1 forms a pinning point. The ends of the first organic layer L1 may not directly contact the ends of other organic layers (i.e., the third organic layer L3, the fourth organic layer L4 and the fifth organic layer L5) disposed on the second organic layer L2. That is, the first organic layer L1 of the organic light-emitting layer EL may be isolated from layers other than the second organic layer L2. Accordingly, the generation of a leakage current may be prevented or reduced.

The second electrode E2 may be formed on the organic light-emitting layer EL. In a case when the second electrode E2 is used as a cathode electrode, the second electrode E2 may be formed of a conductive material with a low work function. In an exemplary embodiment, the second electrode E2 may be formed of Ag, Mg, Al, Pt, Pd, Au, Ni, Nd, Ir, Cr, Li, or Ca. When the formation of the second electrode E2 on the organic light-emitting layer EL is complete, an organic light-emitting element including the first electrode E1, the organic light-emitting layer EL, and the second electrode E2 may be provided as a display element of the organic light-emitting display device.

A method of manufacturing an organic light-emitting display device, according to an exemplary embodiment of the present invention will hereinafter be described with reference to FIGS. 2 through 11. FIGS. 2 through 10 are cross-sectional views illustrating a method of manufacturing an organic light-emitting display device, according to an exemplary embodiment of the present invention. FIG. 11 is a schematic diagram illustrating the variation of the characteristics of first and second pixel-defining layers according to temperature. In FIGS. 1 through 11, like reference numerals indicate like elements, and thus, detailed descriptions thereof will be omitted for convenience.

The method of manufacturing an organic light-emitting display device, according to an exemplary embodiment of the present invention, includes preparing a substrate on which a first electrode is formed (S110), forming a pixel-defining layer (S120), lyophobizing the surface of the pixel-defining layer and lyophilizing the surface of the first electrode (S130), forming a first organic layer (S140) and forming a second organic layer (S150).

A substrate on which a first electrode is formed is prepared (S110).

Figure 2:
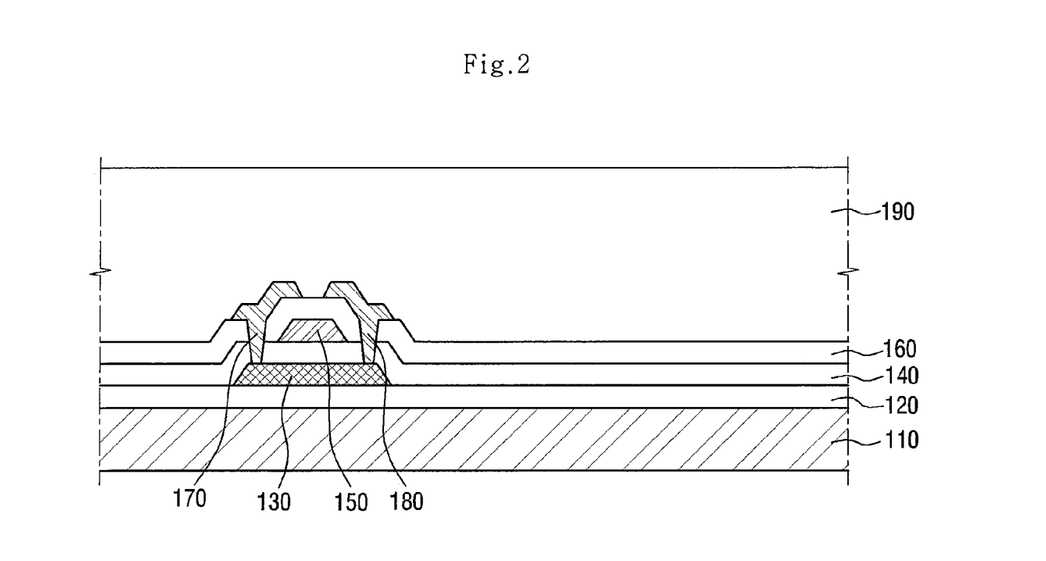
FIGS. 2 through 10 are cross-sectional views illustrating a method of manufacturing an organic light-emitting display device, according to an exemplary embodiment of the present invention.
Figure 3:
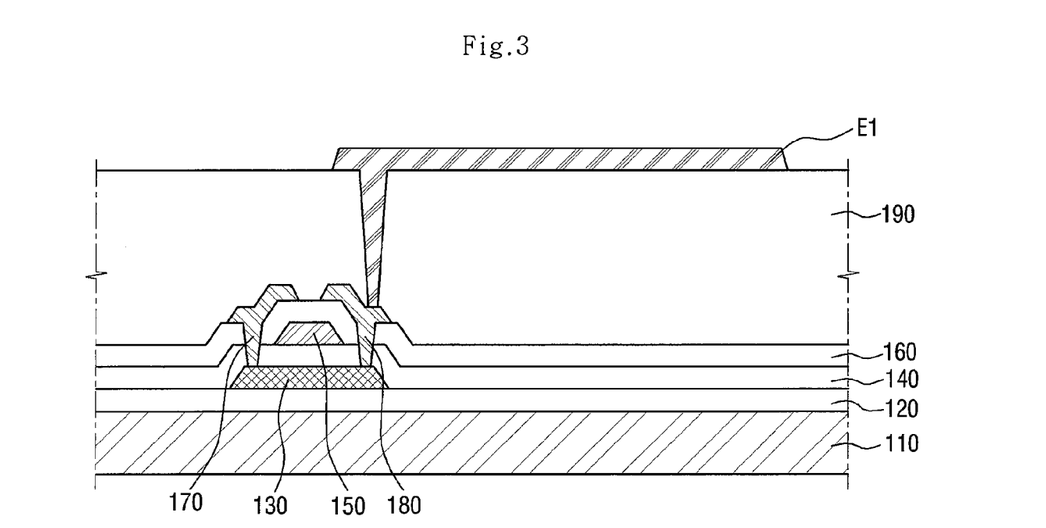

Referring to FIG. 2, the substrate 110, on which a stack of the buffer layer 120, the semiconductor pattern 130, the gate insulating layer 140, the gate electrode 150, the interlayer dielectric layer 160, the source electrode 170, the drain electrode 180, and the planarization layer 190 is formed is prepared. For example, the buffer layer 120 may be formed on the entire surface of the substrate 110. Thereafter, the semiconductor pattern 130 is formed by forming a semiconductor layer (not illustrated) on the buffer layer 120 and patterning the semiconductor layer. Thereafter, the gate insulating layer 140 is formed on the entire surface of the substrate 110 where the semiconductor pattern 130 is formed. Thereafter, the gate electrode 150 is formed by forming a conductive layer (not illustrated) on the gate insulating layer 140 and patterning the conductive layer. Thereafter, the interlayer dielectric layer 160 is formed on the gate electrode 150, and the source electrode 170 and the drain electrode 180 are formed by forming a conductive layer (not illustrated) on the interlayer dielectric layer 160 and patterning the conductive layer. Thereafter, the planarization layer 190 is formed on the entire surface of the substrate 110. Thereafter, referring to FIG. 3, the first electrode E1 is formed on the planarization layer 190. The first electrode E1 may be disposed over the light-emitting region E of the substrate 110. The first electrode E1 may be electrically connected (e.g., coupled) to the drain electrode 180 through a hole that penetrates the planarization layer 190.

Thereafter, a pixel-defining layer is formed (S120).

Figure 4:
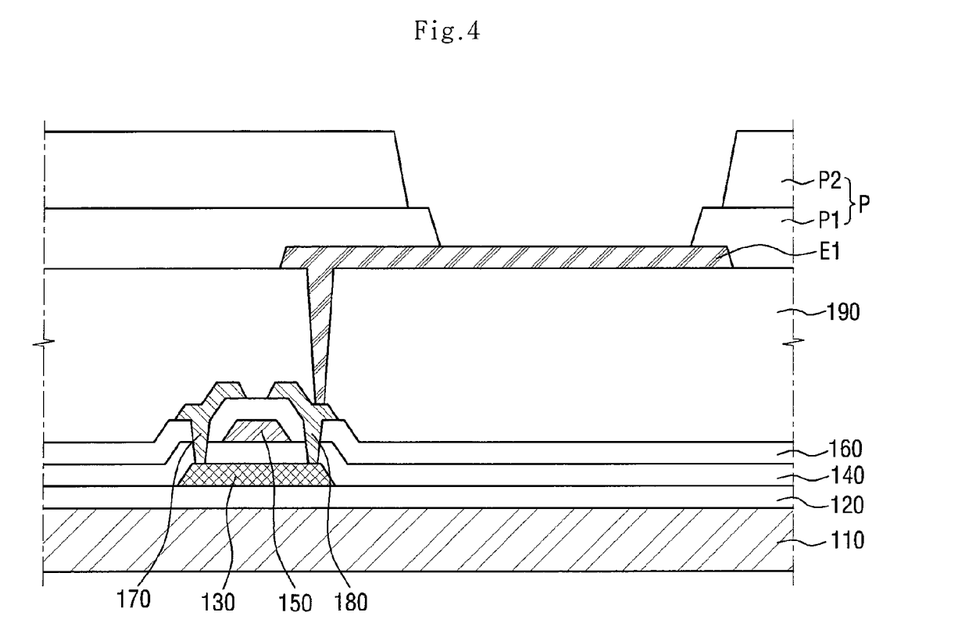

Referring to FIG. 4, the pixel-defining layer P is formed on the planarization layer 190 and the first electrode E1. The pixel-defining layer P may be formed over the non-light-emitting region N of the substrate 110. The pixel-defining layer P may expose the light-emitting region E of the substrate 110. The pixel-defining layer P may have an opening through which the first electrode E1 is at least partially exposed. The pixel-defining layer P may include the first pixel-defining layer P1 and the second pixel-defining layer P2, which is formed on the first pixel-defining layer P1. The first pixel-defining layer P1 may be deposited on the entire surface of the planarization layer 190, and the second pixel-defining layer P2 may be deposited on the first pixel-defining layer P1.

The second pixel-defining layer P2 and the first pixel-defining layer P1 may be patterned by photolithography. The second pixel-defining layer P2 and the first pixel-defining layer P1 may have different slopes from each other. That is, the second pixel-defining layer P2 may have a steeper slope than the first pixel-defining layer P1 to easily introduce a solution composition into the opening. To provide uniform luminance, the first pixel-defining layer P1 may be formed to protrude further into the space in which an organic light-emitting layer is to be formed. The first pixel-defining layer P1 and the second pixel-defining layer P2 may be formed of different materials. The force of bonding between the surface of the first pixel-defining layer P1 and fluorine ions may differ from the force of bonding between the surface of the second pixel-defining layer P2 and fluorine ions. That is, the second pixel-defining layer P2 may have a stronger bonding force than the first pixel-defining layer P1 with respect to fluorine ions.

Thereafter, the surface of the pixel-defining layer is lyophobized, and the surface of the first electrode is lyophilized (S130).

Figure 5:
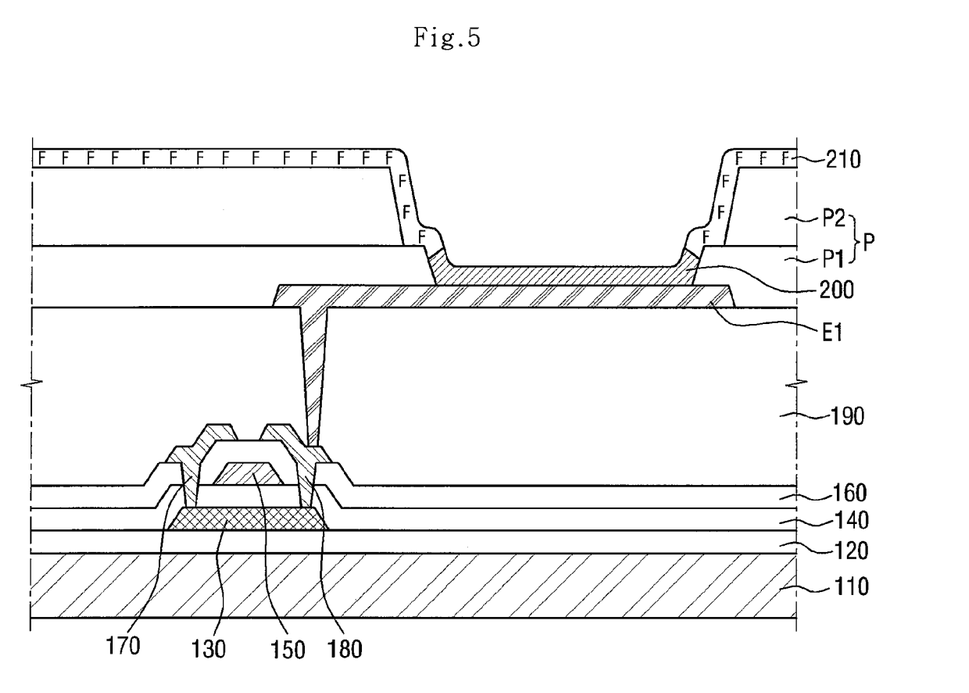

Referring to FIG. 5, the surface of the pixel-defining layer P may be lyophobized, and the surface of the first electrode E1 may be lyophilized. That is, the surface of the first electrode in the opening to which a solution composition is added dropwise may be lyophilized, and the pixel-defining layer P surrounding the opening may be lyophobized. As a result, the solution composition would not combine with the pixel-defining layer P even if applied to the pixel-defining layer P, and may thus be easily introduced into the opening.

A lyophobization process for the pixel-defining layer P may be a process of generating fluorine ions on the surface of the pixel-defining layer P. The lyophobization process may be a process of allowing fluorine ions to adhere onto the surface of the pixel-defining layer P. In the lyophobization process, a fluorine compound such as $CF_4$ may be used as a reaction gas. That is, fluorine ions may be generated by applying plasma or ultraviolet (UV) light in a $CF_4$ gas atmosphere, and the fluorine ions may adhere onto the surface of the pixel-defining layer P. When bonded with fluorine, the surface of the pixel-defining layer P may become lyophobic and may have low surface energy. The degree of lyophilization or lyophobization of the surface of the pixel-defining layer P may be determined by the concentration of fluorine ions on the surface of the pixel-defining layer P.

However, the lyophobization process is not limited to that set forth herein. That is, the pixel-defining layer P may be formed of an organic or inorganic material containing fluorine ions, and a temperature (e.g., a predetermined temperature) may be applied to the pixel-defining layer P so as for the fluorine ions to be exposed on the surface of the pixel-defining layer P. As a result of the lyophobization process, fluorine ions 210 may be generated on the surface of the pixel-defining layer P.

The surface of the first electrode E1 in the opening to which a solution composition is added dropwise may be lyophilized. To adjust particles on the surface of the first electrode E1 and the surface energy of the first electrode E1, the first electrode E1 may be preheated to a temperature (e.g., a predetermined temperature). The temperature (e.g., the predetermined temperature) may be in the range from a first temperature T1 to a second temperature T2, as illustrated in FIG. 11. During the preheating of the first electrode E1, fluorine ions on the surface of the first electrode E1 may be removed. High surface energy 200 may be formed at the surface of the first electrode E1. The high surface energy 200 of the first electrode E1 may affect a lower part of the first pixel-defining layer P1. As a result, the lower side of the first pixel-defining layer P1 may be lyophilized. That is, a lyophilic/lyophobic interface may be formed at a particular location on the side of the first pixel-defining layer P1.

Thereafter, a first organic layer is formed (S140).

The first organic layer L1 may be a layer included in the organic light-emitting layer EL. The first organic layer L1 may be an HIL, but the present invention is not limited thereto. The first organic layer L1 may be formed by a solution process. That is, a solution composition, which is obtained by mixing a solvent and an organic material, may be added dropwise to the surface of the first electrode E1. The solution process may be one of spin coating, inkjet printing, gravure printing, roll-to-roll processing, syringe injection, dip coating, spray coating, relief printing, lithography printing, flexography printing, and screen printing.

Figure 6:
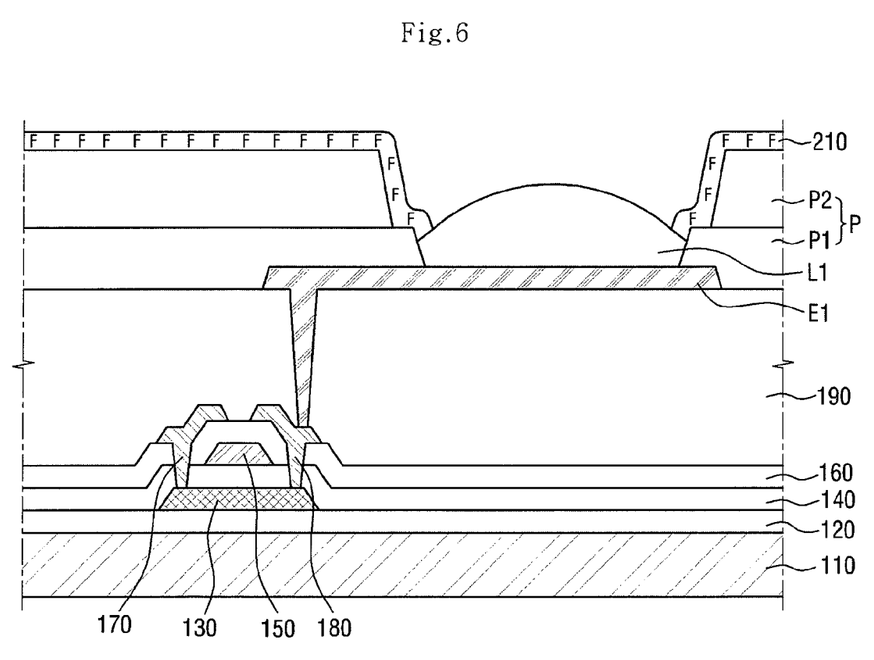

Referring to FIG. 6, the solution composition of the first organic layer L1 may be added dropwise to the surface of the first electrode E1. The first organic layer L1 may form a pinning point at the lyophilic/lyophobic interface located on the side of the first pixel-defining layer P1. A drying process for the first organic layer L1 may be performed at a temperature in the range from the second temperature T2 to a third temperature T3. That is, the solvent of the first organic layer L1 may evaporate at a temperature in the range from the second temperature T2 to the third temperature T3.

Figure 7:
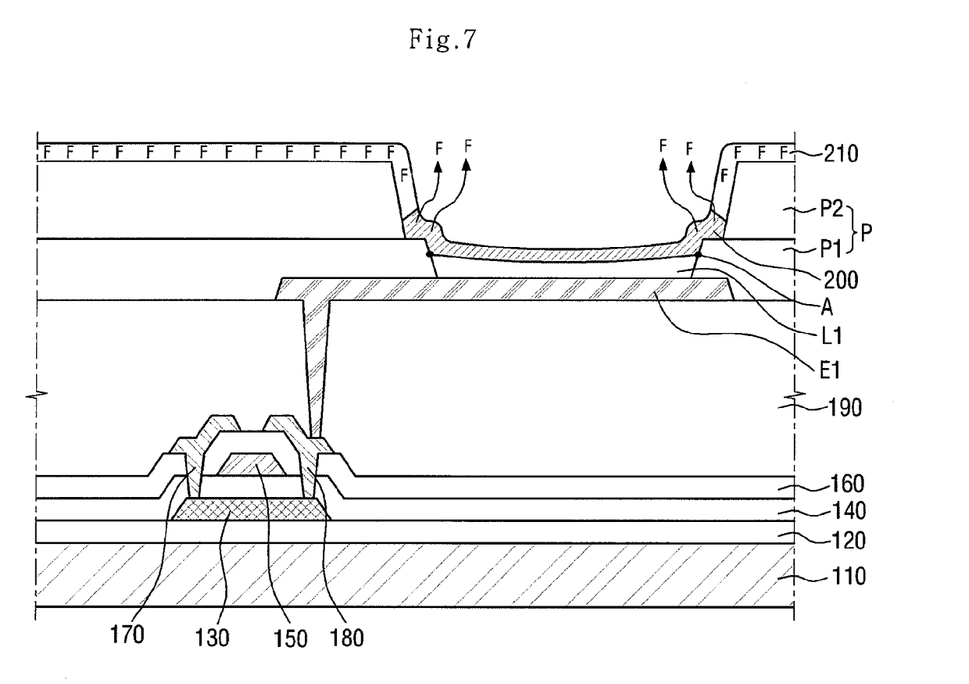

Referring to FIG. 7, the first organic layer L1 may be dried with only the organic material thereof left behind. The first organic layer L1 may be dried while maintaining a pinning point A with the first pixel-defining layer P1. The first organic layer L1 may still contact the first pixel-defining layer P1 at either end thereof. The fluorine ions bonded onto the surface of the first pixel-defining layer P1 may be removed at a temperature in the range from the second temperature T2 to the third temperature T3. That is, the bonding between the first pixel-defining layer P1 and fluorine ions may be severed at a temperature in the range from the second temperature T2 to the third temperature T3. The first pixel-defining layer P1 may be converted from being lyophobic to being lyophilic and may thus show lyophilic properties.

On the other hand, the second pixel-defining layer P2 may still maintain its lyophobic state even at a temperature in the range from the second temperature T2 to the third temperature T3. That is, the second pixel-defining layer P2 may be formed of a material with a stronger bonding force than the material of the first pixel-defining layer P1 with respect to fluorine ions. The surface energy of the first pixel-defining layer P1 that is lyophilic may even affect the lower side of the second pixel-defining layer P2, and a lyophilic/lyophobic interface may be formed at a particular location on the side of the second pixel-defining layer P2. The lyophilic/lyophobic interface may become a pinning point of the second organic layer L2, which is to be formed on the first organic layer L1.

Thereafter, a second organic layer is formed (S150).

Figure 8:
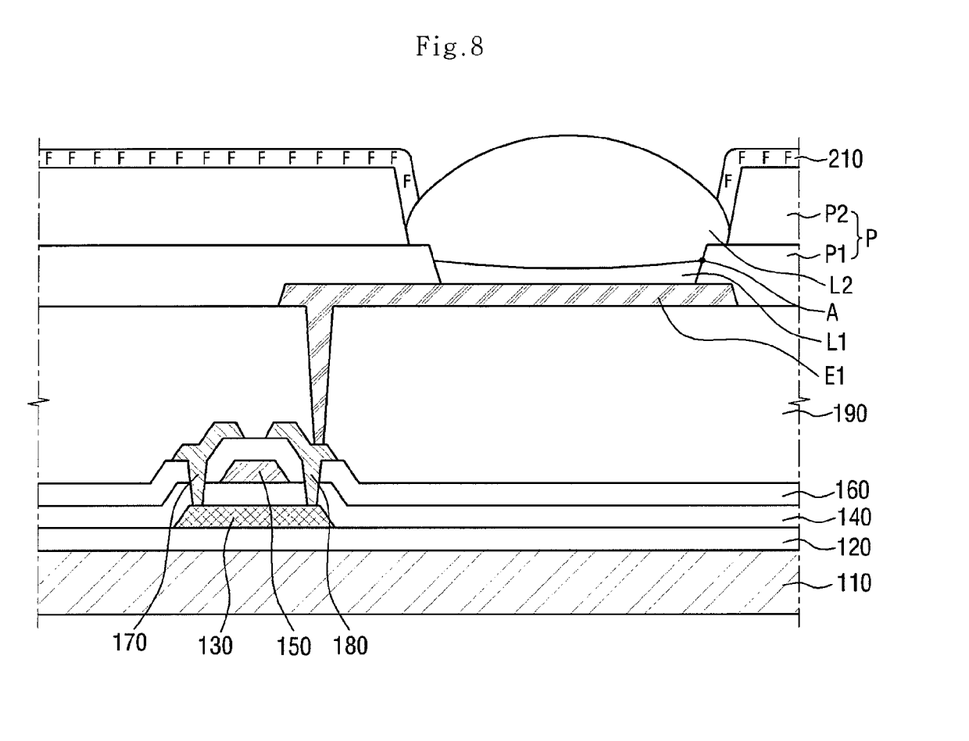

The second organic layer L2 may be a layer included in the organic light-emitting layer EL. The second organic layer L2 may be an HTL, but the present invention is not limited thereto. A solution composition, which is obtained by mixing a solvent and an organic material, may be added dropwise to the surface of the first electrode E1. Referring to FIG. 8, the second organic layer L2 may form a pinning point at the lyophilic/lyophobic interface located on the side of the second pixel-defining layer P2. A drying process for the second organic layer L2 may be performed at a temperature in the range from the second temperature T2 to the third temperature T3. The solvent of the second organic layer L2 may evaporate at a temperature in the range from the second temperature T2 to the third temperature T3.

Figure 9:
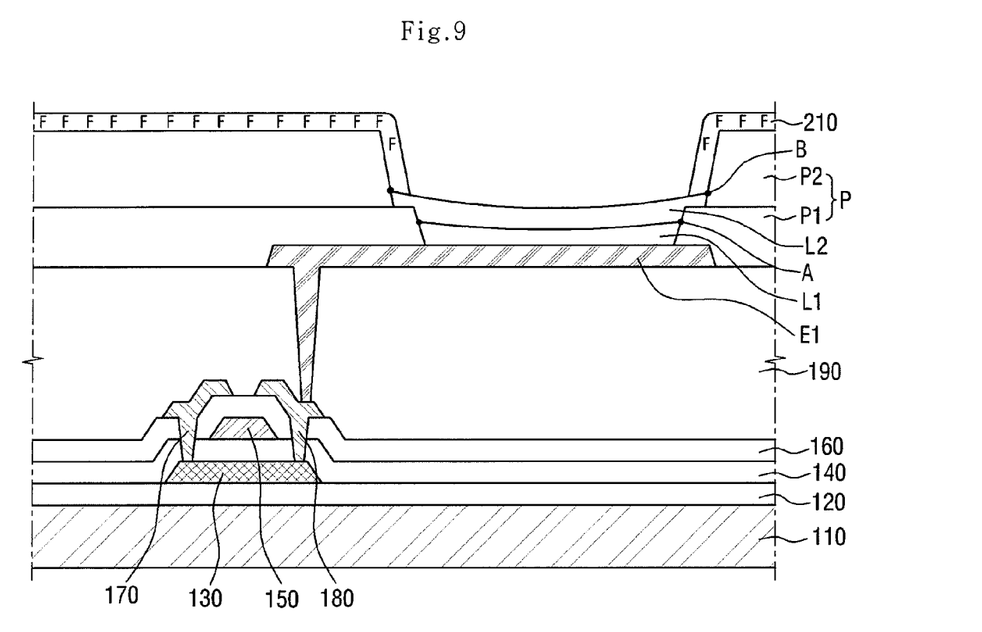

Referring to FIG. 9, the second organic layer L2 may be dried with only the organic material thereof left behind. The second organic layer L2 may be dried while maintaining a pinning point B with the second pixel-defining layer P2. The second organic layer L2 may contact the second pixel-defining layer P2 at either end thereof. The second organic layer L2 may form a pinning point at a different location from where the first organic layer L1 forms a pinning point. As a result, the ends of the first organic layer L1 may not directly contact the ends of the organic layers of the organic light-emitting layer EL that are formed on the second organic layer L2. That is, the first organic layer L1 of the organic light-emitting layer EL may be isolated from other layers than the second organic layer L2. Accordingly, the generation of a leakage current may be prevented or reduced.

Figure 10:
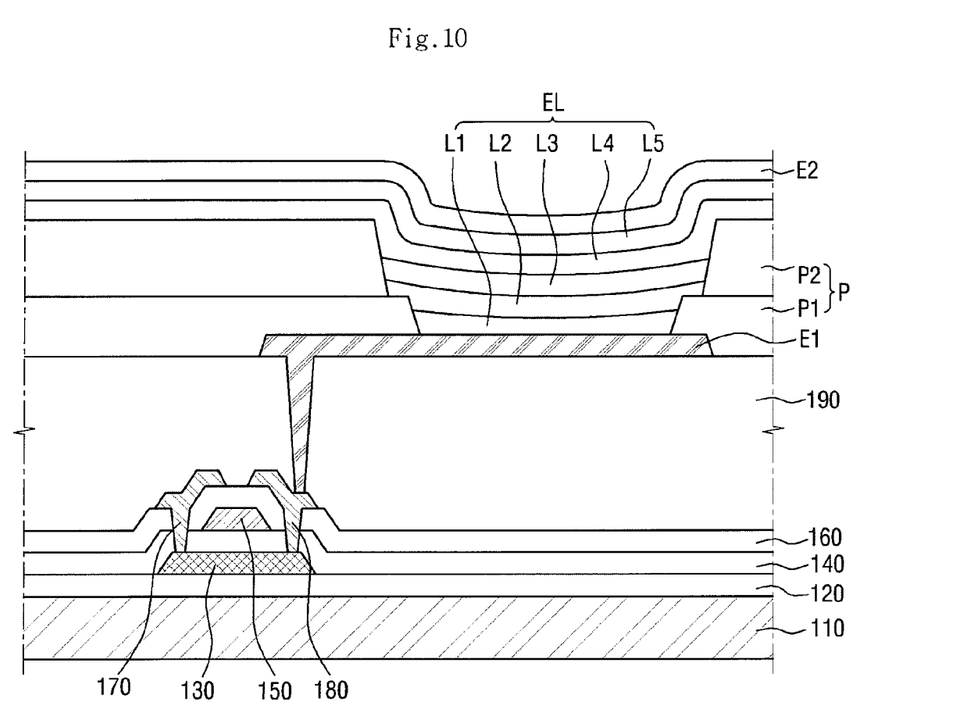
Figure 11:
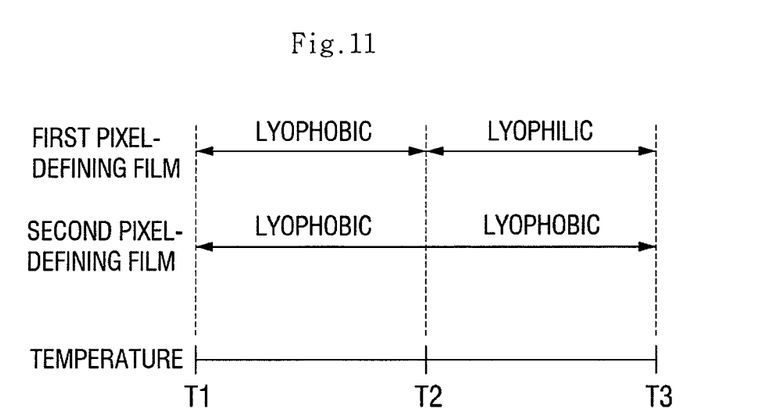
FIG. 11 is a schematic diagram illustrating the variation of the characteristics of first and second pixel-defining layers according to temperature.

Referring to FIG. 10, other layers of the organic light-emitting layer EL may be formed. The organic light-emitting layer EL may also include the third organic layer L3, the fourth organic layer L4, and the fifth organic layer L5, which are sequentially disposed on the second organic layer L2. The third organic layer L3 may be an EML. The third organic layer L3 may be formed by the same or substantially the same solution process used to form the first organic layer L1 and the second organic layer, but the present invention is not limited thereto. The fourth organic layer L4 and the fifth organic layer L5 may be an ETL and an EIL, respectively. The fourth organic layer L4 and the fifth organic layer L5 may be deposited on the entire surface of the third organic layer L3 by sputtering, but the present invention is not limited thereto.

Thereafter, the second electrode E2 is formed on the organic light-emitting layer EL and the pixel-defining layer P. The second electrode E2 may be formed on the entire surface of the substrate 110 as a common electrode.

According to the method of manufacturing an organic light-emitting display device, according to an exemplary embodiment of the present invention, the first organic layer L1 and the second organic layer L2 of the organic light-emitting layer EL form different pinning points from each other, and may thus prevent or substantially prevent the generation of a leakage current that may be caused by bonding the ends of the first organic layer L1 and the ends of other layers together. Accordingly, the efficiency characteristics and the lifetime of an organic light-emitting element may be improved.

In an exemplary embodiment, the drying process for the second organic layer L2 may be performed at a fourth temperature T4, which is higher than the third temperature T3. The fourth temperature T4 may be a temperature for lyophilizing the second pixel-defining layer P2. That is, the bonding between the surface of the second pixel-defining layer P2 and fluorine ions may be severed at the fourth temperature T4. During the formation of the second organic layer L2 at the fourth temperature T4, the fluorine ions bonded onto the surface of the second pixel-defining layer P2 may evaporate. The fluorine ions remaining on the surface of the second pixel-defining layer P2 may infiltrate later into other layers, which may be prevented or substantially prevented in advance by removing the fluorine ions remaining on the surface of the second pixel-defining layer P2.

The method of manufacturing an organic light-emitting display device, according to an exemplary embodiment of the present invention, may include forming the first organic layer L1 in the opening and lyophilizing only the surface of the first pixel-defining layer P1. The lyophilization of the surface of the first pixel-defining layer P1 may be a step of lowering the concentration of fluorine ions at the surface of the first pixel-defining layer P1 below the concentration of fluorine ions at the surface of the second pixel-defining layer P2. That is, the lyophilization of the surface of the first pixel-defining layer P1 may involve heating the first pixel-defining layer P1 to a temperature (e.g., a predetermined temperature) at which the bonding between the surface of the first pixel-defining layer P1 and fluorine ions can be severed. The temperature (e.g., the predetermined temperature) may be higher than a temperature for forming the first organic layer L1.

However, the lyophilization of the surface of the first pixel-defining layer P1 is not limited to the step or method set forth herein. That is, the step of lyophilizing the surface of the first pixel-defining layer P1 may involve applying light only to the surface of the first pixel-defining layer P1. For example, a light-shield member may be disposed over an organic light-emitting display device, and may include a light-transmission portion, which is formed at a location corresponding to the first pixel-defining layer P1. As a result, light can be selectively applied to the surface of the first pixel-defining layer P1. The light may have excellent "straight propagation" properties, and may be intense enough to sever the bonding between the surface of the first pixel-defining layer P1 and fluorine ions. That is, by applying the light, the surface of the first pixel-defining layer P1 may be selectively lyophilized.

While the present invention has been particularly shown and described with reference to exemplary embodiments thereof, it will be understood by those of ordinary skill in the art that various changes may be made therein without departing from the spirit and scope of the present invention as defined by the following claims and their equivalents. The exemplary embodiments should be considered in a descriptive sense only and not for purposes of limitation.

What is claimed is:

1. An organic light-emitting display device, comprising:
   a substrate;
   a pixel-defining layer on the substrate and defining a light-emitting region; and
   an organic light-emitting element over the light-emitting region,
   wherein the pixel-defining layer comprises:
      a first pixel-defining layer on the substrate; and
      a second pixel-defining layer on the first pixel-defining layer,
   wherein the organic light-emitting element comprises:
      a first organic layer contacting the first pixel-defining layer at either end thereof;
      a second organic layer on the first organic layer and contacting the second pixel-defining layer at either end thereof; and
      an organic light-emitting layer on the second organic layer,
   wherein the first pixel-defining layer is lyophilic, and
   wherein a concentration of fluorine ions bonded onto a surface of the first pixel-defining layer differs from a concentration of fluorine ions bonded onto a surface of the second pixel-defining layer.

2. The organic light-emitting display device of claim 1, wherein the second pixel-defining layer is lyophobic.

3. The organic light-emitting display device of claim 1, wherein the first organic layer is formed by using a solvent that evaporates at a temperature in a range from a first temperature to a second temperature and the first pixel-defining layer is lyophobic at a temperature lower than the first temperature.

4. An organic light-emitting display device, comprising:
a substrate;
a pixel-defining layer on the substrate and defining a light-emitting region; and
an organic light-emitting element over the light-emitting region,
wherein the pixel-defining layer comprises:
   a first pixel-defining layer on the substrate; and
   a second pixel-defining layer on the first pixel-defining layer,
wherein the organic light-emitting element comprises:
   a first organic layer contacting the first pixel-defining layer at either end thereof;
   a second organic layer on the first organic layer and contacting the second pixel-defining layer at either end thereof; and
   an organic light-emitting layer on the second organic layer,
wherein the first pixel-defining layer is lyophilic, and
wherein the second pixel-defining layer is lyophilic.

5. An organic light-emitting display device, comprising:
a substrate;
a pixel-defining layer on the substrate and defining a light-emitting region; and
an organic light-emitting element over the light-emitting region,
wherein the pixel-defining layer comprises:
   a first pixel-defining layer on the substrate; and
   a second pixel-defining layer on the first pixel-defining layer,
wherein the organic light-emitting element comprises:
   a first organic layer contacting the first pixel-defining layer at either end thereof;
   a second organic layer on the first organic layer and contacting the second pixel-defining layer at either end thereof; and
   an organic light-emitting layer on the second organic layer,
wherein the first pixel-defining layer is lyophilic, and
wherein the first organic layer is a hole injection layer and the second organic layer is a hole transporting layer.

6. An organic light-emitting display device, comprising:
a substrate;
a pixel-defining layer on the substrate and defining a light-emitting region; and
an organic light-emitting element over the light-emitting region,
wherein the pixel-defining layer comprises:
   a first pixel-defining layer on the substrate; and
   a second pixel-defining layer on the first pixel-defining layer,
wherein the organic light-emitting element comprises:
   a first organic layer contacting the first pixel-defining layer at either end thereof;
   a second organic layer on the first organic layer and contacting the second pixel-defining layer at either end thereof; and
   an organic light-emitting layer on the second organic layer,
wherein the first pixel-defining layer is lyophilic, and
wherein the organic light-emitting layer further comprises a third organic layer on the second organic layer and ends of the third organic layer and ends of the first organic layer do not contact each other.

7. A method of manufacturing an organic light-emitting display device, comprising:
forming a first electrode on a substrate;
forming a pixel-defining layer, which comprises:
   an opening that exposes a part of the first electrode therethrough;
   a first pixel-defining layer that is on the first electrode and the substrate; and
   a second pixel-defining layer that is on the first pixel-defining layer;
lyophobizing a surface of the pixel-defining layer and lyophilizing a surface of the first electrode;
forming a first organic layer in the opening at a temperature in a range from a first temperature to a second temperature where the first pixel-defining layer is lyophilized; and
forming a second organic layer on the first organic layer.

8. The method of claim 7, wherein the forming the first organic layer, comprises:
applying a solution composition, which is obtained by mixing a solvent and a first organic material, into the opening, and
evaporating the solvent at the temperature in the range from the first temperature to the second temperature.

9. The method of claim 7, wherein the forming the second organic layer, comprises:
applying a solution composition, which is obtained by mixing a solvent and a second organic material, into the opening, and
evaporating the solvent at the temperature in the range from the first temperature to the second temperature.

10. The method of claim 9, wherein the second pixel-defining layer is not lyophilized at the temperature in the range from the first temperature to the second temperature.

11. The method of claim 7, wherein the forming the second organic layer, comprises:
applying a solution composition, which is obtained by mixing a solvent and a second organic material, into the opening, and
evaporating the solvent at a third temperature, which is higher than the second temperature.

12. The method of claim 11, wherein the second pixel-defining layer is lyophilized at the third temperature.

13. The method of claim 7, wherein the first organic layer is a hole injection layer and the second organic layer is a hole transporting layer.

14. The method of claim 7, further comprising:
forming a third organic layer on the second organic layer.

15. A method of manufacturing an organic light-emitting display device, comprising:
forming a first electrode on a substrate;
forming a pixel-defining layer, which comprises:
   an opening that exposes a part of the first electrode therethrough;
   a first pixel-defining layer on the first electrode and the substrate; and
   a second pixel-defining layer on the first pixel-defining layer;
lyophobizing a surface of the pixel-defining layer and lyophilizing a surface of the first electrode;
forming a first organic layer in the opening;
lyophilizing only a surface of the first pixel-defining layer by lowering a concentration of fluorine ions at the surface of the first pixel-defining layer below a concentration of fluorine ions at a surface of the second pixel-defining layer; and forming a second organic layer on the first organic layer.

16. The method of claim 15, wherein the lyophilizing the surface of the first pixel-defining layer, comprises:
heating the first pixel-defining layer to a temperature such that a bonding between the surface of the first pixel-defining layer and fluorine ions can be severed.

17. The method of claim 15, wherein the lyophilizing the surface of the first pixel-defining layer, comprises:
applying light only to the surface of the first pixel-defining layer.

18. A method of manufacturing an organic light-emitting display device, comprising:
forming a first electrode on a substrate;
forming a pixel-defining layer, which comprises:
an opening that exposes a part of the first electrode therethrough;
a first pixel-defining layer on the first electrode and the substrate; and
a second pixel-defining layer on the first pixel-defining layer;
lyophobizing a surface of the pixel-defining layer and lyophilizing a surface of the first electrode;
forming a first organic layer in the opening;
lyophilizing only a surface of the first pixel-defining layer; and
forming a second organic layer on the first organic layer,
wherein the first organic layer is a hole injection layer and the second organic layer is a hole transporting layer.

* * * * *